United States Patent
Peng et al.

(10) Patent No.: US 7,835,083 B2
(45) Date of Patent: Nov. 16, 2010

(54) DISK STRUCTURE, MANUFACTURING METHOD THEREOF AND OPTICAL TWEEZERS DEVICE USING THE SAME

(75) Inventors: Chen Peng, Taipei (TW); Fung-Hsu Wu, Taoyuan County (TW); Chung-Cheng Chou, Taoyuan County (TW); Wai Wang, Taoyuan County (TW); Long Hsu, Hsinchu (TW); Cheng-Hsien Liu, Hsinchu (TW)

(73) Assignee: Benq Materials Corp., Gueishan Township, Taoyuan County (TW)

( * ) Notice: Subject to any disclaimer, the term of this patent is extended or adjusted under 35 U.S.C. 154(b) by 406 days.

(21) Appl. No.: 12/035,487

(22) Filed: Feb. 22, 2008

(65) Prior Publication Data
US 2009/0040620 A1      Feb. 12, 2009

(30) Foreign Application Priority Data
Aug. 10, 2007    (TW) .............................. 96129688 A

(51) Int. Cl.
G02B 15/14    (2006.01)

(52) U.S. Cl. ...................................... 359/676

(58) Field of Classification Search .................. 359/676
See application file for complete search history.

(56) References Cited
U.S. PATENT DOCUMENTS
7,295,357 B2 *  11/2007  Maehara ...................... 359/15

* cited by examiner

Primary Examiner—Scott J Sugarman
Assistant Examiner—Vipin M Patel
(74) Attorney, Agent, or Firm—Thomas, Kayden, Horstemeyer & Risley

(57) ABSTRACT

A disk structure is disposed in an optical tweezers device including a light source for producing incident laser light. The disk structure includes a first substrate, a second substrate and a reflective layer. The second substrate is disposed with respect to the first substrate. One of the first substrate and the second substrate has at least one flow path. The reflective layer, which is adhered to the second substrate, is disposed between the first substrate and the second substrate. After the incident laser light passes through the first substrate and then reaches the reflective layer, the incident laser light is reflected back as reflective laser light by the reflective layer to form reflective laser light. A tweezers light field is formed in the flow path by both the reflective laser light and the incident laser light.

13 Claims, 6 Drawing Sheets

DISK STRUCTURE, MANUFACTURING METHOD THEREOF AND OPTICAL TWEEZERS DEVICE USING THE SAME

This application claims the benefit of Republic of Taiwan, R.O.C. application Serial No. 096129688, filed Aug. 10, 2007, the subject matter of which is incorporated herein by reference.

BACKGROUND OF THE INVENTION

1. Field of the Invention

The invention relates in general to a disk structure and a manufacturing method thereof and an optical tweezers device using the same, and more particularly to a disk structure having a reflective layer, a manufacturing method thereof and an optical tweezers device using the same.

2. Description of the Related Art

The application of the optical controlling technology includes optical levitation and laser cooling and trapping, etc. With the development of the optical controlling technology, an optical tweezers device has been widely used in many fields, such as micro-electro mechanical field, biological field or medicine field; furthermore, the optical tweezers device with a single laser beam presented by Arthur Ashkin et al. is applied frequently in this field. The laser beam is focused within an optical tweezers device by a lens with high numerical aperture (NA) ratio and high magnification to control a nano-level particle at the focal point. As the optical tweezers device controls the particle neither touching nor invading it, the structure of the particle would not be damaged. Therefore, the optical tweezers device can be effectively used in controlling biological particles, such as cells, blood cells, sperms, or microbes.

Presently, laser beam applications of optical tweezers can be categorized into single laser beam and dual laser beam. In general, when applying the single laser beam to the optical tweezers device, the single laser beam has to pass through a lens with higher NA ratio so as to get a larger force for controlling a particle. However, a lens with high NA ratio is expensive. Mention of the dual laser beam, although it doesn't need to be with a high NA ratio lens, two single laser beams are still required to form the dual laser beam. Therefore, the usage cost of the dual laser beam is comparably high as well.

SUMMARY OF THE INVENTION

The invention is directed to a disk structure, a manufacturing method thereof and an optical tweezers device using the same. The disk structure has a reflective layer for reflecting the incident laser light to form the reflective laser light. Thus, the incident laser light and the reflective laser light controlling a movement of a particle are treated as two single laser beams.

According to a first aspect of the present invention, a disk structure is provided. The disk structure is disposed in an optical tweezers device comprising a light source, which is for producing incident laser light. The disk structure comprises a first substrate, a second substrate and a reflective layer. The first substrate has at least one flow path. The second substrate is disposed with respect to the first substrate. The reflective layer adhered to the second substrate is disposed between the first substrate and the second substrate. After the laser light passes through the first substrate and then reaches the reflective layer, the incident laser light is reflected back as reflective laser light by the reflective layer. A tweezers light field is formed in the flow path by both the reflective laser light and the incident laser light.

According to a second aspect of the present invention, a disk structure is provided. The disk structure is disposed in an optical tweezers device, which comprises a light source for producing incident laser light. The disk structure comprises a first substrate, a second substrate and a reflective layer. The second substrate having at least one flow path is disposed with respect to the first substrate. The reflective layer, which is adhered to the second substrate, is disposed between the first substrate and the second substrate. After the incident laser light passes through the first substrate and then reaches the reflective layer, the incident light is reflected by the reflective layer to form reflective laser light. A tweezers light field is formed in the flow path by both the reflective laser light and the incident laser light.

According to a third aspect of the present invention, a manufacturing method of a disk structure is provided. The manufacturing method comprises the following steps. Firstly, a first substrate is formed with at least one flow path on it. Next, a reflective layer is formed on a second substrate. Then, the first substrate and the second substrate are adhered to each other. The reflective layer is between the first substrate and the second substrate.

According to a fourth aspect of the present invention, a manufacturing method of a disk structure is provided. The manufacturing method comprises the following steps. Firstly, a first substrate is provided. Next, a second substrate is formed with at least one flow path on it. Then, a reflective layer is formed on the second substrate. After that, the first substrate and the second substrate are adhered to each other. The reflective layer is between the first substrate and the second substrate.

According to a fifth aspect of the present invention, an optical tweezers device is provided. The optical tweezers device comprises a light source, a disk structure and a focusing lens. The light source is used for producing incident laser light. The disk structure comprises a first substrate, a second substrate and a reflective layer. The first substrate has at least one flow path. The second substrate is disposed with respect to the first substrate. The reflective layer, which is adhered to the second substrate, is disposed between the first substrate and the second substrate. The focusing lens is disposed at a side of the first substrate. After the incident laser light sequentially passes through the focusing lens and the first substrate and then reaches the reflective layer, the incident laser light is reflected by the reflective layer to form reflective laser light. A tweezers light field is formed in the flow path by both the reflective laser light and the incident laser light.

According to a sixth aspect of the present invention, an optical tweezers device is provided. The optical tweezers device comprises a light source, a disk structure and a focusing lens. The light source is used for producing incident laser light. The disk structure comprises a first substrate, a second substrate and a reflective layer. The second substrate having at least one flow path is disposed with respect to the first substrate. The reflective layer, which is adhered to the second substrate, is disposed between the first substrate and the second substrate. The focusing lens is disposed at a side of the first substrate. After the incident laser light sequentially passes through the focusing lens and the first substrate and then reaches the reflective layer, the incident laser light is reflected by the reflective layer to form reflective laser light. A tweezers light field is formed in the flow path by both the reflective laser light and the incident laser light.

The invention will become apparent from the following detailed description of the preferred but non-limiting embodiments. The following description is made with reference to the accompanying drawings.

DETAILED DESCRIPTION OF THE INVENTION

Figure 1:
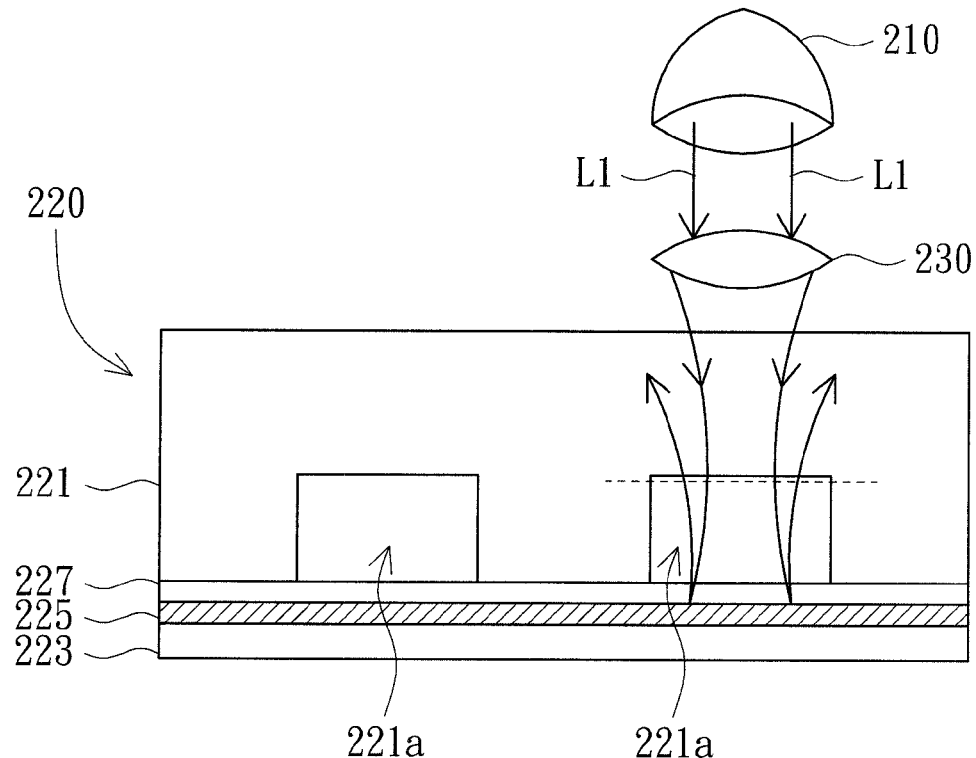
FIG. 1 is a cross-sectional view of an optical tweezers device according to a first embodiment of the invention.

A disk structure, a manufacturing method thereof and an optical tweezers device using the same are disclosed in the invention. When the incident laser light reaches a reflective layer of the disk structure, a reflective laser light is formed by reflecting the incident laser light from the reflective layer. A tweezers light field is formed in the flow path of the disk structure by the reflective laser light and the incident laser light to control a movement of the particles in the flow path. In order to clearly show the features of the present invention, some elements would be omitted and the components in the drawings would be illustrated simply.

First Embodiment

Referring to FIG. 1, a cross-sectional view of an optical tweezers device according to a first embodiment of the invention is shown. The present embodiment of the invention exemplifies an optical tweezers device 200 including a light source 210, a disk structure 220 and a focusing lens 230. The light source 210 is used for producing incident laser light L1. The disk structure 220 comprises a first substrate 221, a second substrate 223 and a reflective layer 225. The first substrate 221 has at least one flow path 221a. The second substrate 223 is disposed with respect to the first substrate 221. The reflective layer 225 is disposed between the first substrate 221 and the second substrate 223, and the second substrate 223 is fully covered by the reflective layer 225. The focusing lens 230 is disposed at a side of the first substrate 221. After the incident laser light L1 produced by the light source 210 sequentially passes through the focusing lens 230 and the first substrate 221 and then reaches the reflective layer 225, a reflective laser light is formed by reflecting the incident laser light L1 from the reflective layer 225. Thus, a tweezers light field is formed in the flow path 221a by both the reflective laser light and the incident laser light L1.

The focusing lens 230 of the optical tweezers device 200 is disposed on the optical path between the light source 210 and the disk structure 220, so that the incident laser light L1 produced by the light source 210 sequentially passes through the focusing lens 230 and the first substrate 221 for reaching the reflective layer 225. In the present embodiment of the invention, the focusing lens 230 can be a zoom lens capable of adjusting the focal location to have the position of the tweezers light field in the flow path 221a changed. The zoom lens can be a liquid lens or preferably be an electro-liquid lens.

When different voltages are applied to an electro-liquid lens, the surface curvature of the electro-liquid lens would be changed so as to adjust the focal location accordingly. Then, when an electro-liquid lens is used as the zoom lens, the focal location of the zoom lens can be adjusted so as to change the position of the tweezers light field in the flow path 221a. In addition, both the zoom lens and the disk structure 220 are movable to change the position of the tweezers light field in the flow path 221a.

As illustrated in FIG. 1, the incident laser light L1 and the reflective laser light are treated as a dual laser beam. At this time, if at least one particle (not illustrated) is received in the flow path 221a, the incident laser light L1 and the reflective laser light can be used to control the movement of the particle in the flow path 221a.

The conventional dual laser beam is formed by two single laser beams with the identical intensity but the opposite directions. Then, a particle can be controlled by an optical pressure balance caused from the two single laser beams. As the two single laser beams are produced separately by a device to form the dual laser beam, the cost for using the dual laser beam is too high. Based on the design of the optical tweezers device 200 and a single laser beam (the incident laser light L1) applied to the optical tweezers device 200, it provides the same effect as the dual laser beam for controlling a particle via the optical pressure balance. As a result, compared with the conventional dual laser beam, the optical tweezers device 200 of the present embodiment of the invention has the advantages of lower usage cost.

The disk structure 220 of the present embodiment of the invention is further elaborated as follows. The disk structure 220 further includes an adhesive layer 227 disposed between the first substrate 221 and the reflective layer 225. The reflective layer 225 is fully covered by the adhesive layer 227 via spin coating. In order to cover a flat surface of the second substrate 223 by the reflective layer 225, the reflective layer 225 can be formed by sputtering or vaporization disposition. Preferably, the reflective layer 225 is formed on the second substrate 223 by sputtering.

In the present embodiment of the invention, the adhesive layer 227 can be made of anti-electrostatic adhesive, and the reflective layer 225 can be made of silver, aluminum, copper or alloy. The adhesive layer 227 is used for adhering the first substrate 221 and the second substrate 223 and for preventing the clustering of the electrostatic charges because of the material of the adhesive layer 227. In addition, the adhesive layer 227 is also used for preventing the interaction between the reflective layer 225 and particles or a solution contained in the flow path 221a.

When taking the processing of biological cells as an example: generally, biological cells survive in a solution with a specific pH value. If the reflective layer 225 directly contacts with the solution in the flow path 221a, the reflective layer 225 may be eroded. In addition, the metallic cations of the reflective layer 225 would easily affect the biological cells in the flow path 221a. Thus, the adhesive layer 227 protects the biological cells in the flow path 221a and the reflective layer 225 simultaneously. The adhesive layer 227 of the disk structure 220 is preferably made of a bio-compatible material when the application of the disk structure 220 is related to the biological field.

Materials of the first substrate 221 and the adhesive layer 228 that the incident laser light L1 passes through should both be transparent. That is, the first substrate 221 can be a transparent substrate made of glass ($SiO_x$), polymethylmethacrylate (PMMA), polyethylene terephthalate (PET), poly carbonate (PC) or polystyrene (PS). The adhesive layer 227 can be made of anti-electrostatic adhesive which is transparent as well. Furthermore, it should be taken into a consideration that the material of the adhesive layer 227 can not affect the function of the reflective layer 225 because of the directly contact of the adhesive layer 227 and the reflective layer 225. Thus, the adhesive layer 227 can be made of optical disc adhesive or optical pressure sensitive adhesive which are transparent materials. The second substrate 223 can be a transparent substrate or a non-transparent substrate. The materials of the first substrate 221 and the second substrate 223 are depended on a user's demands.

The manufacturing method of the disk structure 220 in FIG. 1 is disclosed as follows. FIGS. 2A~2D show the processes of the manufacturing method of the disk structure in FIG. 1. FIG. 3 is a flowchart of the manufacturing method of the disk structure in FIG. 1.

Figure 2A:
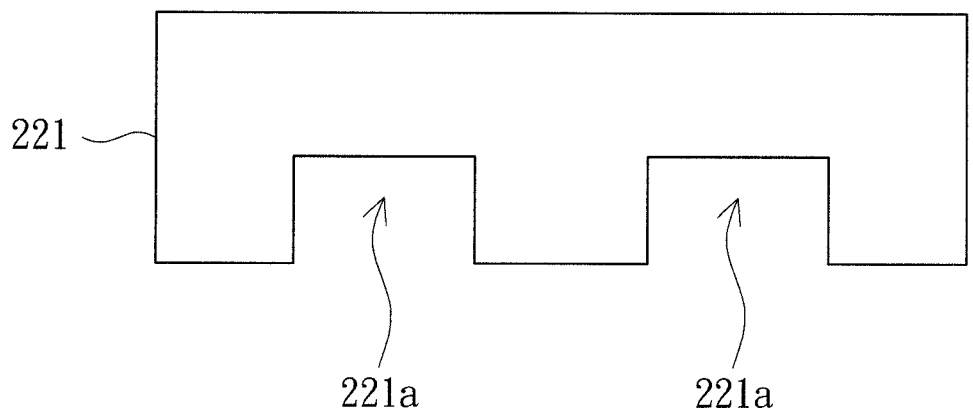
FIGS. 2A-2D show the processes of the manufacturing method of the disk structure in FIG. 1.
Figure 3:
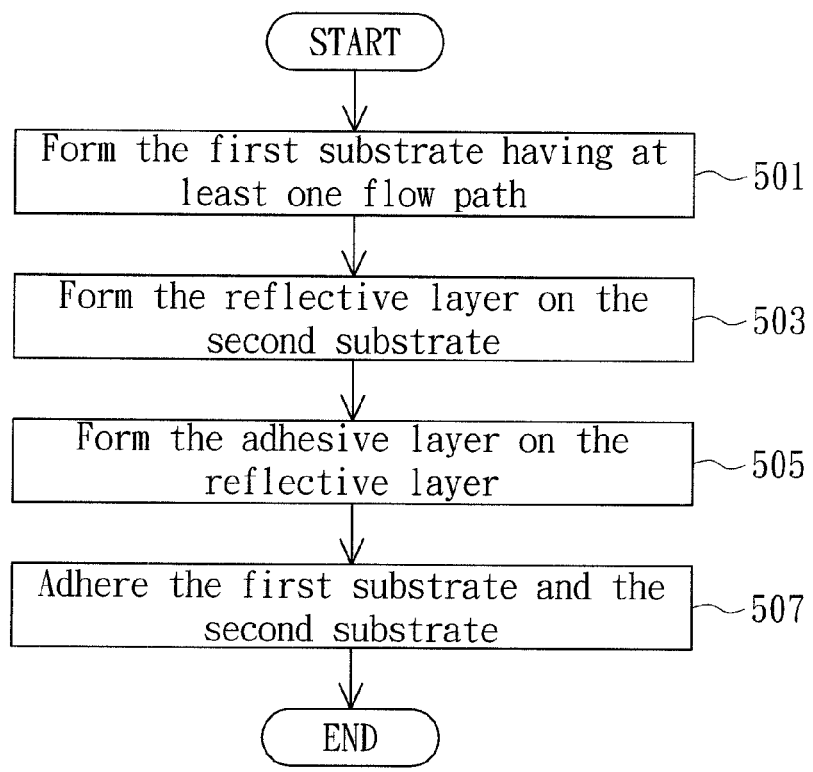
FIG. 3 is a flowchart of the manufacturing method of the disk structure in FIG. 1.

Firstly, as illustrated in FIG. 2A, at least one flow path 221a of the first substrate 221 is formed in the step 501. In the step 501, the first substrate 221 which has the flow path 221a with it can be formed by injection molding, casting, laser cutting or etching.

Figure 2B:
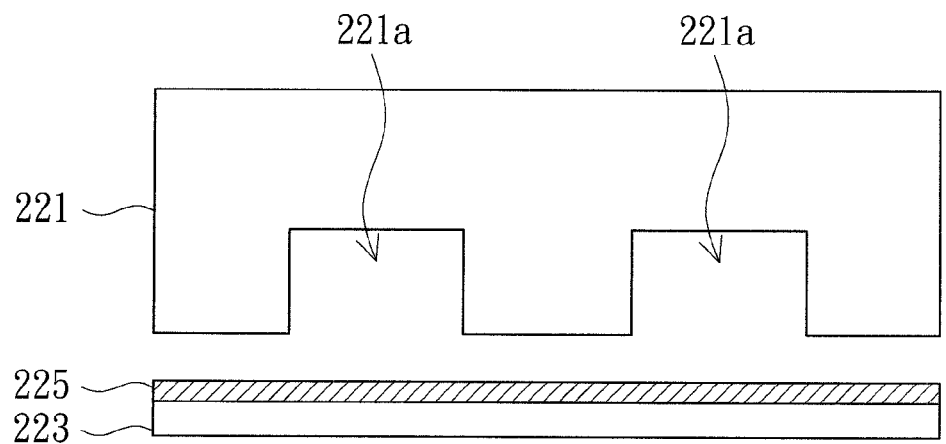

Next, as illustrated in FIG. 2B, the reflective layer 225 is formed on the second substrate 223 in the step 503. In the step 503, the reflective layer 225 is formed on the second substrate 223 by sputtering or vaporization disposition. Preferably, the reflective layer 225 is formed by sputtering.

Figure 2C:
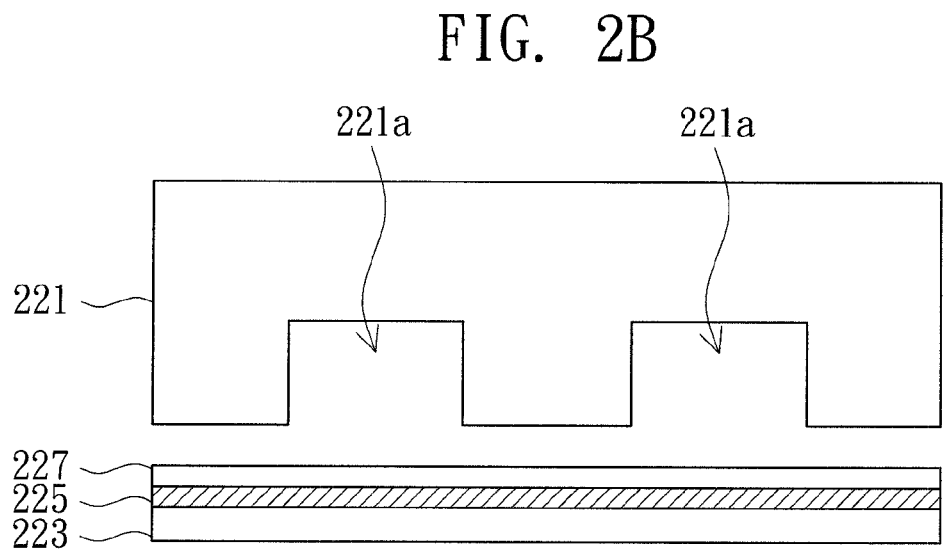

Then, as illustrated in FIG. 2C, the adhesive layer 227 is formed on the reflective layer 225 in the step 505. In step the 505, the adhesive layer 227 is formed on the reflective layer 225 by spin coating.

Figure 2D:
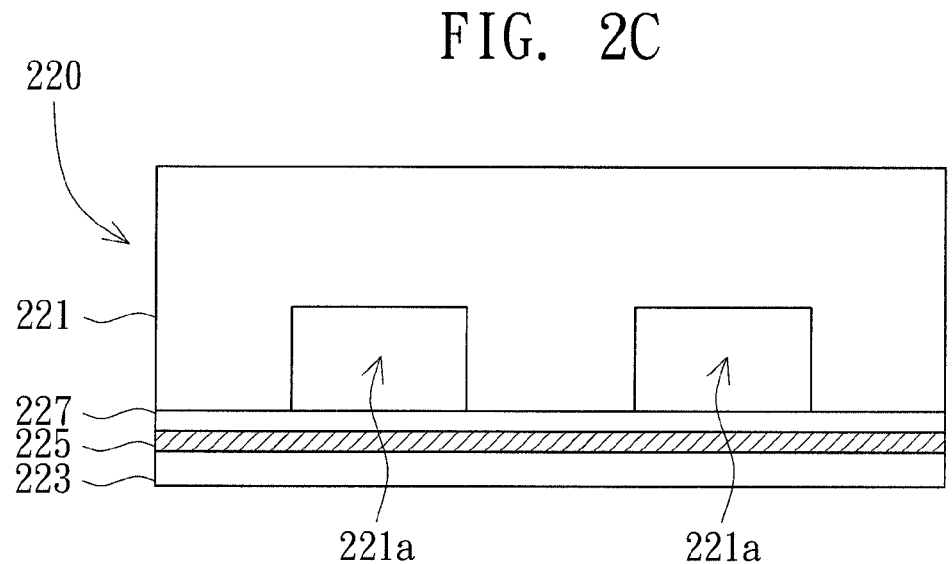

After that, as illustrated in FIG. 2D, the first substrate 221 and the second substrate 223 are adhered to each other in the step 507. The reflective layer 225 is positioned between the first substrate 221 and the second substrate 223. When the disk structure 220 is incorporated with the light source 210 and the focusing lens 230 in FIG. 1, the incident laser light L1 produced by the light source 210 and the reflective laser light reflected by the reflective layer 225 can be used for controlling the movement of the particles in the flow path 221a. As the disk structure 220 can be manufactured by the ordinary manufacturing process of optical disks, the device for manufacturing the optical disks can be used to manufacture the disk structure 220 as well. In other words, the manufacturing cost of the disk structure 220 is relatively reduced.

Second Embodiment

Figure 4:
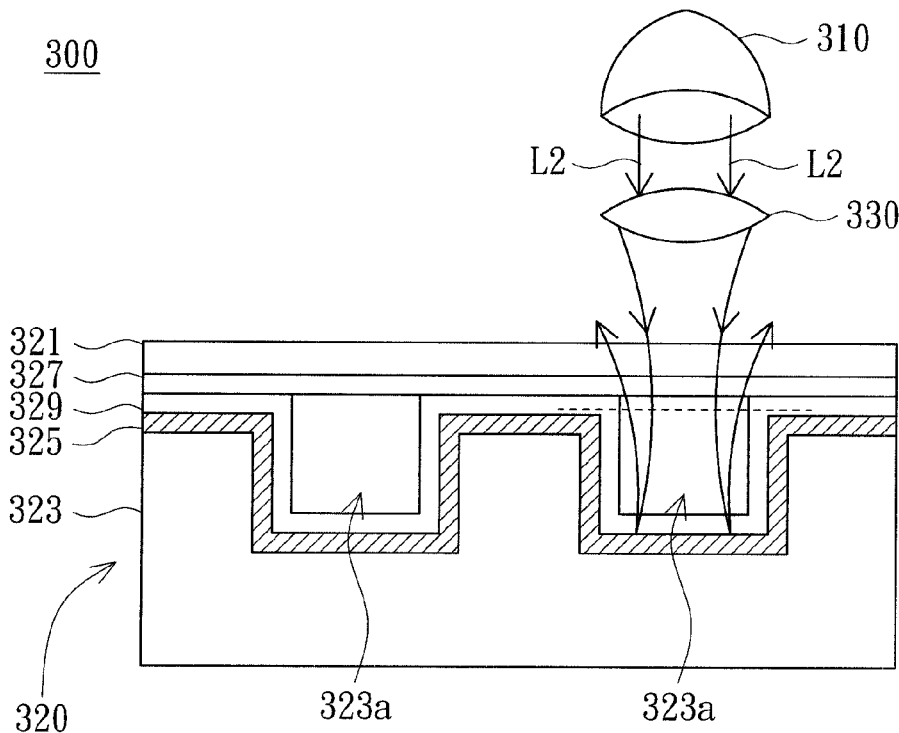
FIG. 4 is a cross-sectional view of an optical tweezers device according to a second embodiment of the invention.

Compared with the optical tweezers device 200 in the first and the second embodiments, the difference is the location of the flow path. Referring to FIG. 4, a cross-sectional view of an optical tweezers device according to a second embodiment of the invention is shown. The present embodiment of the invention exemplifies the optical tweezers device 300 including a light source 310, a disk structure 320 and a focusing lens 330. In addition to a first substrate 321, a second substrate 323 disposed with respect to the first substrate 321, an adhesive layer 327 and a reflective layer 325, the disk structure 320 further includes a protective layer 329. Furthermore, there is at least one flow path 323a positioned at the second substrate 323. The incident laser light L2 produced by the light source 310 sequentially passes through the focusing lens 330, the first substrate 321, the adhesive layer 327 and the protective layer 329 and then reaches the reflective layer 325. A reflective laser light is formed by reflecting the incident laser light L2 from the reflective layer 325, so that a tweezers light field is formed in the flow path 323a by both the reflective laser light and the incident laser light L2. Thus, the incident laser light L2 and the reflective laser light are as a dual laser beam. At this time, if at least one particle (not illustrated) is received in the flow path 323a, the incident laser light L2 and the reflective laser light can be used to control the movement of the particle in the flow path 323a.

The focusing lens 330 can be a zoom lens such as a liquid lens. The liquid lens is capable of adjusting the focal location so as to change the position of the tweezers light field in the flow path 323a. In addition, the zoom lens and the disk structure 320 are movable to adjust the position of the tweezers light field in the flow path 323a.

In the present embodiment of the invention, the reflective layer 325 fully covers the surface, which has at least one flow path 323a positioned thereon, of the second substrate 323. The reflective layer 325 is made of silver, aluminum, copper or alloy. When taking the processing of biological cells in the flow path 323a of the disk structure 320 as an example: generally, biological cells survive in a solution with a specific pH value. Thus, if the reflective layer 325 is not properly protected, the reflective layer 325 made of metallic material would expose to the flow path 323a and directly contact with the solution in the flow path 323a. Under such situation, the reflective layer 325 may be eroded because of the solution, and the biological cells would be easily affected by the metallic cations of the reflective layer 325 as well. To avoid the interaction between the biological cells and the solution in the flow path 323a and reflective layer 325, the protective layer 329 is preferably formed between the first substrate 321 and the reflective layer 325. In addition, the reflective layer 325 is fully covered by the protective layer 329, so that the reflective layer 325 is separated from both the solution and the biological cells in the flow path 323a. The protective layer 329 is made of indium tin oxide (ITO), for example.

As disclosed above, the reflective layer 325 is formed on the surface, which has at least one flow path 323a, of the second substrate 323, and the reflective layer 325 is fully covered by the protective layer 329. Thus, in order to reserve the original shape and space of the flow path 323a, the protective layer 329 and the reflective layer 325 are formed by sputtering or vaporization deposition, so that the protective layer 329 and the reflective layer 325 are formed according to the shape of the flow path 323a. Preferably, the protective layer 329 and the reflective layer 325 are formed by sputtering.

The incident laser light L2 produced by the light source 310 sequentially passes through the focusing lens 330 and the first substrate 321, the adhesive layer 327 and the protective layer 329 of the disk structure 320 to reach the reflective layer 325. Therefore, the components (the focusing lens 330, the first substrate 321, the adhesive layer 327 and the protective layer 329) that the laser light L2 passes through are made of transparent material. The protective layer 329 can be made of indium tin oxide. As indium tin oxide is a transparent metallic oxide, indium tin oxide can prevent the clustering of the electrostatic charges at the second substrate 323. Although the material of the protective layer 329 exemplifies indium tin oxide, the protective layer 329 can be made of other transparent materials capable of preventing the clustering of the electrostatic charges. Moreover, the disk structure 320 can be used for containing a biological cell and thereby the protective layer 329 is preferably made of a bio-compatible material.

The manufacturing method of the disk structure 320 in FIG. 4 is disclosed as follows. FIG. 5A~5F show the processes of the manufacturing method of the disk structure in FIG. 4. FIG. 6 is a flowchart of the manufacturing method of the disk structure in FIG. 4.

Figure 5A:
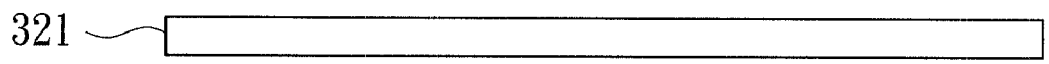
FIGS. 5A-5F show the processes of the manufacturing method of the disk structure in FIG. 4.
Figure 6:
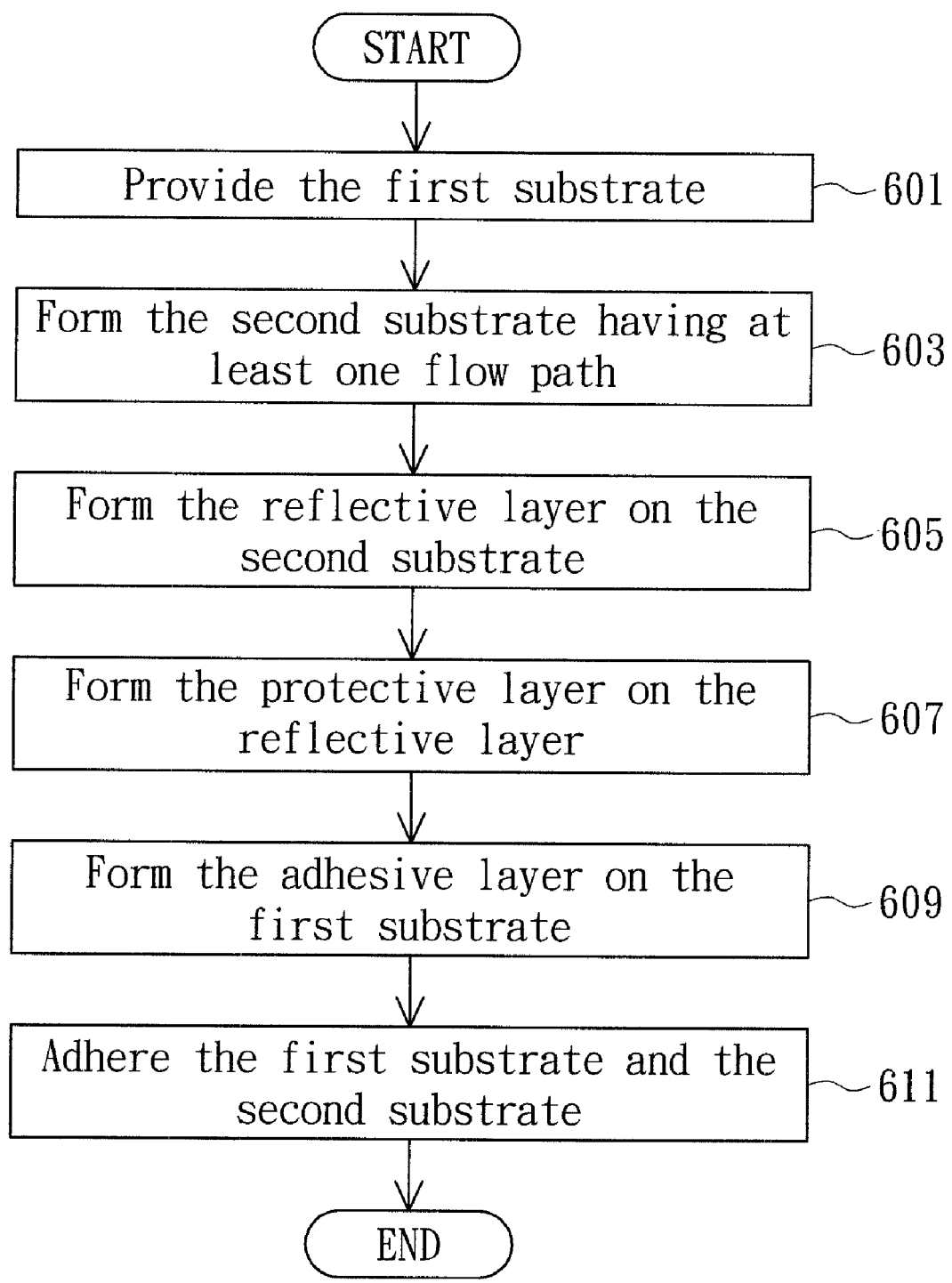
FIG. 6 is a flowchart of the manufacturing method of the disk structure in FIG. 4.

Firstly, as illustrated in FIG. 5A, the first substrate 321 is provided in the step 601.

Figure 5B:
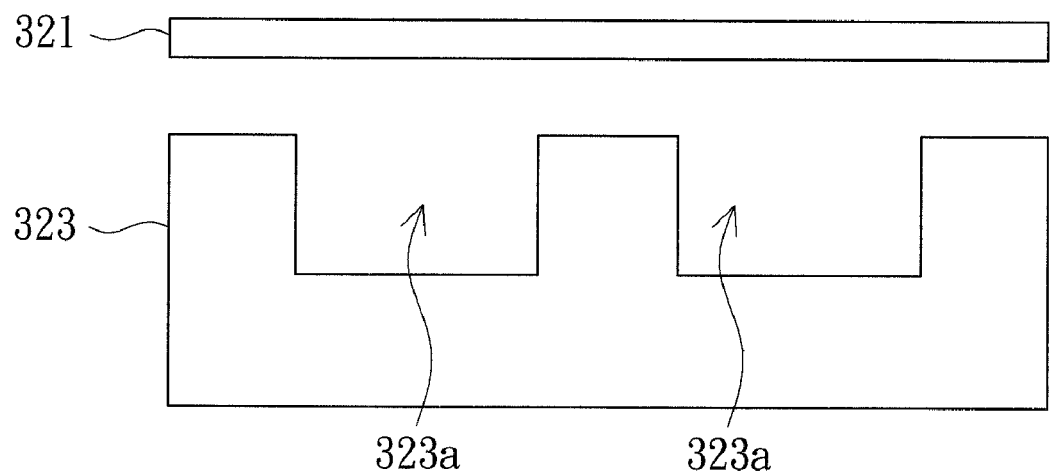

Next, as illustrated in FIG. 5B, the second substrate 323 with at least one flow path 323a is formed in the step 603. In the step 603, the second substrate 323 with at least one flow path 323a is formed by injection molding, casting, laser cutting or etching.

Figure 5C:
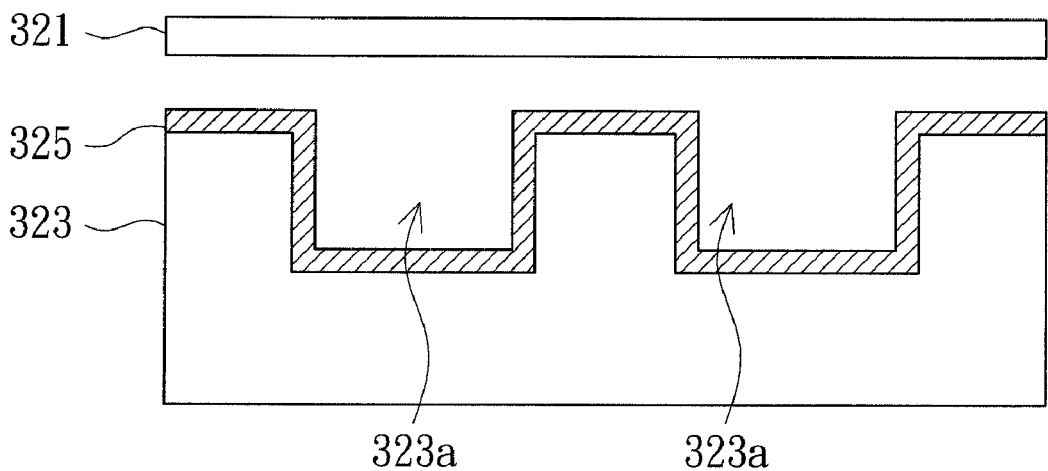

Then, as illustrated in FIG. 5C, the reflective layer 325 is formed on the second substrate 323 in the step 605. In order to keep the shape and the space of the flow path 323a unchanged, the reflective layer 325 on the second substrate 323 can be formed by sputtering or vaporization deposition. Preferably, in the step 605, the reflective layer 325 is formed by sputtering.

Figure 5D:
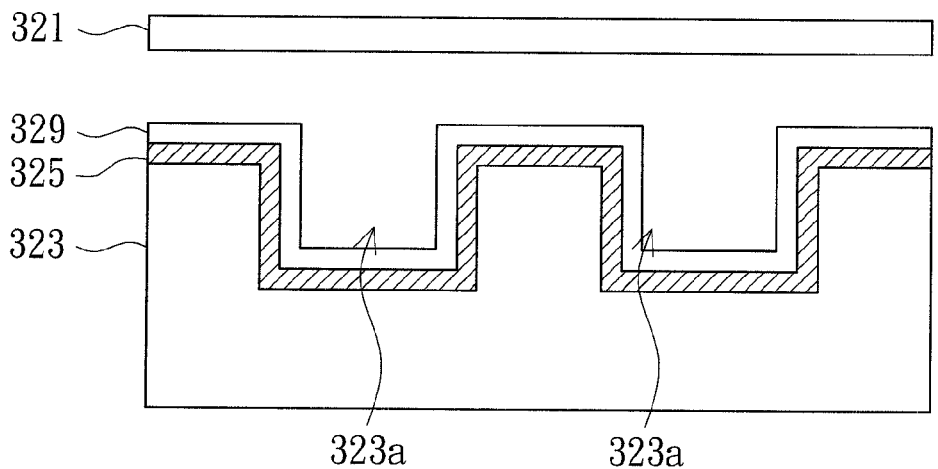

After that, as illustrated in FIG. 5D, the protective layer 329 is formed on the reflective layer 325 in the step 607. Similar to the step 605, the protective layer 329 on the reflective layer 325 can be formed by sputtering or vaporization deposition, so that the shape and the space of the flow path 323a can keep unchanged. Preferably, in the step 607, the protective layer 329 is formed by sputtering.

Figure 5E:
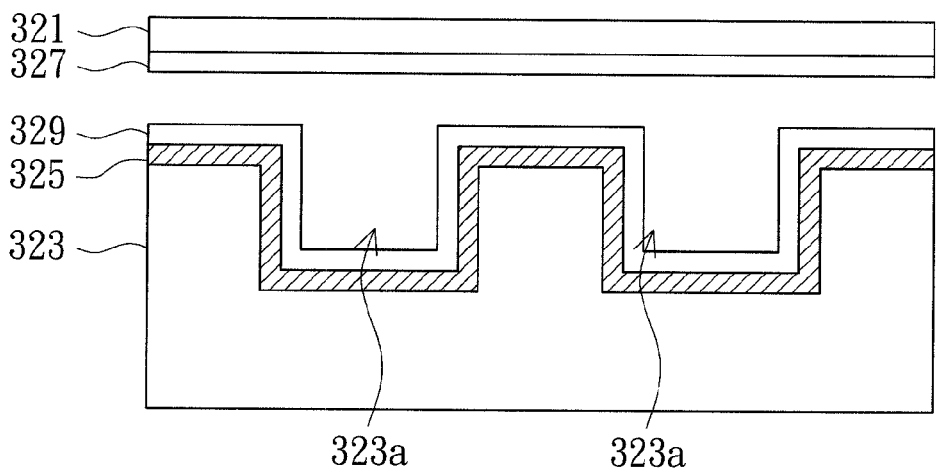

Then, as illustrated in FIG. 5E, the adhesive layer 327 is formed on the first substrate 321 in the step 609. Because the adhesive layer 327 is adhered to a flat surface of the first substrate 321, the adhesive layer 327 is formed on the first substrate 321 by spin coating in the step 609.

Figure 5F:
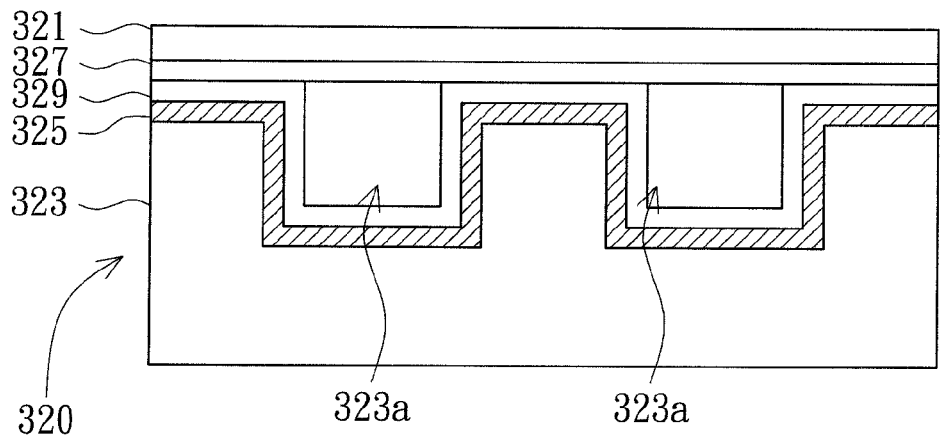

After that, as illustrated in FIG. 5F, the first substrate 321 and the second substrate 323 are adhered to each other in the step 611. The reflective layer 325 is between the first substrate 321 and the second substrate 323. When the disk structure 320 is incorporated with the light source 310 and the focusing lens 330 in FIG. 4, the incident laser light L2 produced by the light source 310 and the reflective laser light reflected by the reflective layer 325 can be used for controlling the movement of the particles in the flow path 323a. As the disk structure 320 can be manufactured by the ordinary manufacturing process of optical disks, the device for manufacturing the optical disks can be used to manufacture the disk structure 320 as well. In other words, the manufacturing cost of the disk structure 320 is effectively reduced.

According to the disk structure, the manufacturing method thereof and the optical tweezers device using the same disclosed in the above embodiments, the movement of the particles in the flow path is controllable by a dual laser beam formed by the incident laser light produced by the light source and the reflective laser light reflected by the reflective layer. The disk structure can be manufactured by the ordinary manufacturing process of an optical disk. Therefore, the disk structure can be manufactured by the existing devices.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An optical tweezers device, comprising:
a light source for producing incident laser light;
a disk structure, comprising:
   a first substrate;
   a second substrate disposed with respect to the first substrate, wherein one of the first substrate and the second substrate has at least one flow path; and
   a reflective layer, which is adhered to the second substrate, disposed between the first substrate and the second substrate; and
a focusing lens disposed at a side of the first substrate, wherein after the incident laser light sequentially passes through the focusing lens and the first substrate and then reaches the reflective layer, the incident laser light is reflected back as reflective laser light by the reflective layer and a tweezers light field is formed in the flow path by both the incident laser light and the reflective laser light.

2. The optical tweezers device according to claim 1, wherein the focusing lens is a zoom lens.

3. The optical tweezers device according to claim 2, wherein the zoom lens is a liquid lens.

4. The optical tweezers device according to claim 2, wherein the zoom lens and the disk structure are capable of moving with respect to each other.

5. The optical tweezers device according to claim 1, wherein the disk structure further comprises:
an adhesive layer disposed between the first substrate and the reflective layer.

6. The optical tweezers device according to claim 5, wherein the adhesive layer is disposed between the first substrate and the reflective layer by spin coating.

7. The optical tweezers device according to claim 5, wherein the adhesive layer is made of anti-electrostatic transparent adhesive.

8. The optical tweezers device according to claim 1, wherein the reflective layer is made of silver, aluminum, copper or alloy.

9. The optical tweezers device according to claim 1, wherein the first substrate is a transparent substrate.

10. The optical tweezers device according to claim 1, wherein the reflective layer is disposed on the second substrate by sputtering or vaporization deposition.

11. The optical tweezers device according to claim 1, wherein the disk structure further comprises:
a protective layer disposed between the first substrate and the reflective layer and covering the reflective layer.

12. The optical tweezers device according to claim 11, wherein the protective layer is disposed between the first substrate and the reflective layer by sputtering or vaporization deposition.

13. The optical tweezers device according to claim 11, wherein the protective layer is made of indium tin oxide.

* * * * *